United States Patent [19]

Kuribayashi

[11] 4,311,994
[45] Jan. 19, 1982

[54] SIGNAL LEVEL INDICATION WITH DIFFERENT COLORS

[75] Inventor: Yasuji Kuribayashi, Yokohama, Japan

[73] Assignee: Victor Company of Japan, Limited, Yokohama, Japan

[21] Appl. No.: 20,033

[22] Filed: Mar. 13, 1979

[30] Foreign Application Priority Data

Mar. 14, 1978 [JP] Japan .............................. 53/32246[U]

[51] Int. Cl.³ ............................................. G08B 21/00
[52] U.S. Cl. .................................. 340/661; 328/148; 340/662
[58] Field of Search ................. 340/661, 660, 662, 663, 340/664, 377; 328/146, 147, 148, 149; 307/350, 360

[56] References Cited

U.S. PATENT DOCUMENTS

| | | | |
|---|---|---|---|
| 2,658,167 | 11/1953 | Harris | 328/148 X |
| 2,786,136 | 3/1957 | Lubkin | 328/148 |
| 2,912,685 | 11/1959 | Thomas | 340/377 |
| 3,673,588 | 6/1972 | Riff | 340/663 X |
| 3,809,985 | 5/1974 | Krause et al. | 340/664 X |
| 3,930,198 | 12/1975 | Williamson, Jr. | 340/653 X |
| 3,964,039 | 6/1976 | Craford et al. | 340/660 |
| 4,149,160 | 4/1979 | Bozarth et al. | 307/360 X |

*Primary Examiner*—John W. Caldwell, Sr.
*Assistant Examiner*—Daniel Myer
*Attorney, Agent, or Firm*—Lowe, King, Price & Becker

[57] ABSTRACT

A signal level indicator comprises first and second voltage comparators responsive to the low and high levels of an input signal, respectively. First and second switching transistors are provided. The base of the first transistor is connected to the output of the first comparator through a first diode, the base of the second transistor being connected directly to the output of the second comparator. First and second light-emitting diodes which emit different colors are respectively energized in response to the conduction of the first and second transistors. The collector of the second transistor is further connected to the cathode of the first diode through a second diode to cause the first diode to switch off to thereby turn off the first transistor in response to the turn-on of the second transistor.

20 Claims, 1 Drawing Figure

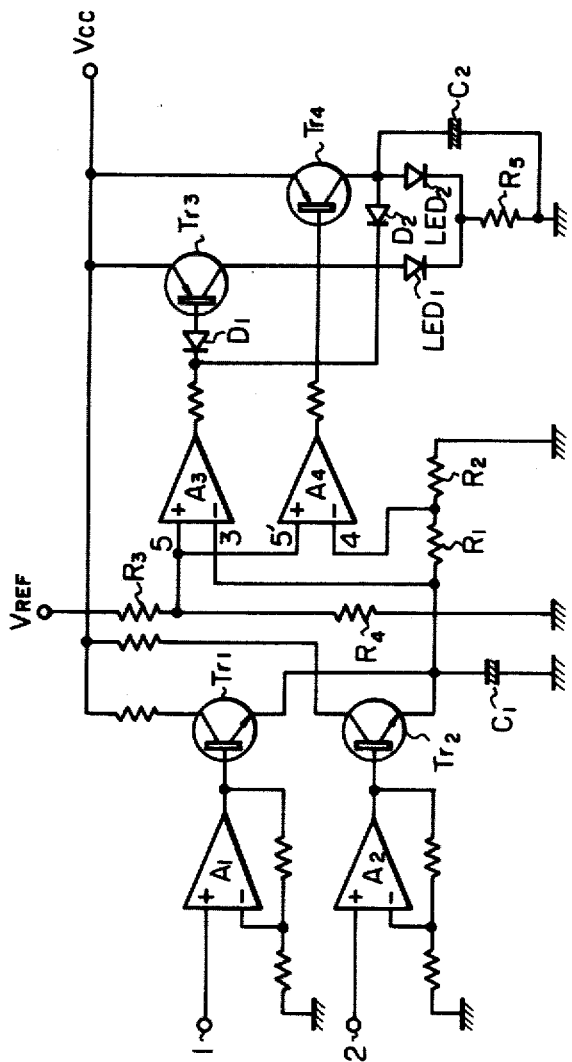

SIGNAL LEVEL INDICATION WITH DIFFERENT COLORS

FIELD OF THE INVENTION

The present invention relates to an improved signal level indicator for indicating a signal having an excessive level. The invention is particularly suitable for indicating the level of an input signal to a recorder.

BACKGROUND OF THE INVENTION

Level meters are conventionally employed in tape recorders for indicating the analog values of a recording signal level. However, the conventional level meters are not capable of responding to rapidly varying input levels. Peak level indicators using light-emitting diodes have been developed in which a different number of diodes is energized depending on a detected signal level. All of these light-emitting diodes emit radiation of a single color. Each diode is identified with a numeral indicative of a signal level corresponding with the number.

SUMMARY OF THE INVENTION

An object of the invention is to provide a signal level indicator which facilitates discrimination of an alarm condition against normal signal level conditions.

Another object of the invention is to provide a signal level indicator having a plurality of light emissive elements, each of which emits different wave length radiation, associated with different colors, in response to different signal levels.

A further object of the invention is to provide a signal level indicator having a plurality of light emissive elements of different colors each corresponding to a particular condition in which only one element emits radiation at a time.

The level indicator of the invention comprises first and second comparators for comparing the level of an input signal with low and high reference voltages to generate first and second output signals in response to the input signal crossing the first and second reference levels, respectively. First and second switching transistors are provided. The base of the first transistor is connected via a first diode to the output of the first comparator, the base of the second transistor being connected directly to the output of the second comparator. First and second light-emitting diodes (LED's) are connected in series with the first and second transistors, respectively, to emit radiations associated with different colors. The collector of the second transistor is further connected to the cathode of the first diode through a second diode to cause the first diode to turn off in response to the conduction of the second transistor. The first signal is generated in response to the input signal being higher than the low reference level to render the first transistor conductive, resulting in the energization of the first light-emitting diode. The first LED, when energized, emits green light to indicate that the input signal level is within allowable safe limits. The second signal is generated when the input signal is at a level higher than the high reference level, causing the second transistor to be switched into conduction. Conduction of the second transistor causes the second light-emitting diode to be energized to emit red light to indicate that the signal level is outside of the safe limits. At the same time, conduction of the second transistor produces a voltage drop that causes the first diode and therefore the first transistor to be switched off, so that the green light emitted by the first LED is extinguished.

BRIEF DESCRIPTION OF THE DRAWINGS

The invention will be further described with the accompanying sole drawing which illustrates the circuit diagram of the signal level indicator of the invention.

DETAILED DESCRIPTION

In the sole drawing, the signal level indicator of the invention which indicates whether either channel of a stereo signal has a level that exceeds allowable safe limits of a recorder for the signal and for indicating whether either channel of the signal exceeds a minimum threshold level includes a pair of linear amplifiers A1 and A2 respectively responsive to stereo input signals applied to right and left channel input terminals 1 and 2. The outputs of the linear amplifiers A1 and A2 are respectively coupled to the base electrodes of NPN transistors $Tr_1$ and $Tr_2$, the emitters of which are connected to one electrode of capacitor C1, having a second, grounded electrode. Transistors $Tr_1$ and $Tr_2$ are biased to supply amplified and rectified currents to capacitor C1. The DC voltage developed across capacitor C1 is coupled directly to inverting input terminal 3 of a voltage comparator A3 for comparison with a reference voltage supplied from a voltage divider formed by resistors R3 and R4, connected across a supply voltage $V_{REF}$. The voltage across capacitor C1 is also applied to another voltage divider formed by resistors R1 and R2, having a junction directly coupled to inverting input terminal 4 of a second voltage comparator A4 for comparison with the reference voltage. Each of voltage comparators A3 and A4 respectively provides a low level output in response to the input signal thereof exceeding the reference voltage applied to noninverting input terminals 5 and 5' thereof. The output terminal of the comparator A3 is connected to the cathode of diode D1, having an anode connected to the base of a switching transistor $Tr_3$, having a collector connected to the anode of light emitting diode LED1, having a cathode connected to ground through current limiting resistor R5; the emitter of transistor $Tr_3$ being connected to a voltage source Vcc. The diode D1 is poled to conduct when the output voltage of the comparator A3 is at a low voltage level to allow passage of current from the emitter to the base of transistor $Tr_3$ to turn it on. The light emitting diode LED1 is energized to emit green light in response to the turn-on of transistor $Tr_3$.

The output terminal of comparator A4 is connected to the base of a switching transistor $Tr_4$ having a collector connected to the anode of a light emitting diode LED2, having an anode connected to ground through constant current resistor R5, the emitter of transistor $Tr_4$ being connected to the voltage supply source Vcc. The collector of transistor $Tr_4$ is connected to the anode of diode D2, having a cathode connected to the cathode of diode D1 so there is coupling from the collector of transistor $Tr_4$ to the base of transistor $Tr_3$ via diodes D2 and D1 to turn off transistor $Tr_3$ in response to the turn-on of transistor $Tr_4$.

Since the emitters of transistors $Tr_1$ and $Tr_2$ are connected together, they provide the action similar to that of an OR circuit, so that the voltage developed across capacitor C1 is proportional to the one input signal which is greatest in amplitude. If the level of either of the input signals at terminal 1 or 2 increases from a low voltage level, so that voltage developed across capacitor C1 becomes greater than the reference voltage, the comparator A3 switches to a low output state to bias the switching transistor Tr₃ into conduction. The light emitting diode LED1 is thus energized to emit green light indicating that the input signal is above a low reference level, that is, the signal level applied to the tape recorder operating in a recording mode is within the normal acceptable range.

A further increase in the input signal level at either of terminals 1 or 2 causes a further increase in the voltage developed across capacitor C1. Thereby the voltage proportioned by the resistors R1 and R2 increases and eventually becomes greater than the reference voltage at terminal 5' of comparator A4. Thereby comparator A4 is switched to a low output state, to turn on switching transistor Tr₄, causing energization of light emitting diode LED2. During this transient period while LED2 is activated, the voltage across the emitter and base of transistor Tr₃ is approximately 0.6 volts and the forward bias voltage of the diode D1 is approximately 0.6 volts, so that the combined voltage drop across the emitter of transistor Tr₃ and the cathode of D1 is approximately 1.2 volts. On the other hand, the voltage drop across the emitter and collector of transistor Tr₄ is approximately 0.2 volts and the forward bias voltage of diode D2 is also approximately 0.6 volts, a combined voltage drop of 0.8 volts. Thereby the potential at the cathode of diode D2 with respect to ground has a tendency to be higher than the potential at the cathode of diode D1 with respect to ground. Therefore, diode D1 is biased off to turn off transistor Tr₃ and hence LED1. Thus, the color indication is changed from green to red to indicate the presence of a signal having an excessive signal level.

Diode D2 blocks the current from the comparator A3 to prevent turn on of LED2 in response to a high voltage output of comparator A3, while the diode D1 provides an additional voltage drop to the base of transistor Tr₃ so that the potential at the cathode of D1 with respect to ground has a tendency to be lower than that at the cathode of diode D2 when transistor Tr₄ is conductive.

If a high level input signal is present only for a short duration of time, the occurrence of such peak signals goes unnoticed. This is because a capacitor C2 is connected between the collector of transistor Tr₄ and ground, in shunt with light emitting diode LED2. If transistor Tr₄ is driven briefly into conduction, the voltage across capacitor C2 does not reach a sufficiently high level to bias diode LED2 into an emitting state because the voltage across a capacitor cannot change suddenly. Once diode LED2 is energized to a light emitting state it continues briefly as an emitter after turn-off of transistor Tr₄, because capacitor C2 discharges through the light emitting diode LED2 and the current limiting resistor R5. Because of the high resistance value of resistor R5, the capacitor C2 is discharged at a much lower rate than the rate at which it is charged.

What is claimed is:
1. A signal level indicator comprising:
   means responsive to the level of an input signal applied thereto for generating a first output signal when the input signal is above a first reference level and generating a second output signal when the input signal is above a second reference level greater than the first reference level;
   a first light emissive element for emitting light of a first color;
   a first transistor having a control electrode connected to be responsive to said first output signal and first and second controlled electrodes, said first light emissive element being connected to a voltage source through said first and second controlled electrodes of said transistor to emit said light in response to said first output signal;
   a second light emissive element for emitting light of a second color;
   a second transistor having a control electrode responsive to said second output signal, said second transistor having first and second controlled electrodes, said second light emissive element being connected to said voltage source through said first and second controlled electrodes of said second transistor for emission of said light in response to said second output signal;
   means coupled between the first controlled electrode of said second transistor to the control electrode of said first transistor for rendering said first transistor nonconductive in response to the conduction of said second transistor;
   a capacitor connected between the first controlled electrode of said second transistor and ground; and
   a current limiting resistor connected in series with the controlled electrodes of the first and second transistors for providing a substantially constant current to said first and second transistors, said capacitor being connected in parallel with said current limiting resistor.

2. A signal level indicator as claimed in claim 1, wherein said means for rendering said first transistor nonconductive comprises a first diode connected between the control electrode of said first transistor and the output of said first comparator and a second diode connected between the first control electrode of said second transistor and one electrode of said first diode, to cause said first diode to become nonconductive in response to the conduction of said second transistor.

3. A signal level indicator as claimed in claim 2, wherein said first and second diodes have their like electrodes connected together to the output of said first comparator.

4. Apparatus for visually indicating whether either channel of a stereo signal has a level that exceeds allowable safe limits of a recorder for the signal and for indicating whether either channel of the signal exceeds a minimum threshold level comprising rectifier means responsive to both channels of the signal for deriving a DC level indicative of the amplitude of the channel having the highest level, means responsive to the DC level and a reference level for deriving first and second signals in response to the DC level being above a first amplitude associated with the threshold level and the DC level being above a second amplitude associated with the allowable safe limit of the recorder, the second amplitude being greater than the first amplitude so that both the first and second signals are derived in response to the DC level being above the allowable safe limit, first and second light emitting diodes which, when forward biased, emit radiation associated with different colors, and means responsive to the first and second signals for forward biasing the first light emitting diode to the exclusion of the second light emitting diode in response to the first signal being derived to the exclusion of the second signal and for forward biasing the second light emitting diode to the exclusion of the first light emitting diode in response to both of the first and second signals being derived.

5. The apparatus of claim 4 wherein the means for forward biasing the first and second light emitting diodes includes first and second transistors respectively having first and second control electrodes responsive to the first and second signals, as well as first and second paths respectively controlled by the voltages at said first and second control electrodes to supply forward biasing currents to said first and second light emitting diodes, and a feedback connection responsive to the bias of the second light emitting diode for applying a voltage to the control electrode of the first transistor to cut-off current flow through the first transistor and the first light emitting diode while the second light emitting diode is forward biased to a light emitting state.

6. The apparatus of claim 5 wherein the feedback connection includes a first diode having first and second electrodes respectively connected to be responsive to current supplied by the second path to the second light emitting diode and to a terminal responsive to voltage from the first signal, a second diode connected between said terminal and the control electrode of the first transistor, said first diode being poled to pass current from the second path to the terminal in response to the second light emitting diode being forward biased, said second diode being poled to be back biased in response to the current flowing through the first diode to the terminal.

7. The apparatus of claim 6 wherein the first and second transistors respectively include first and second emitter collector impedances in the first and second paths, the first and second emitter collector impedances being respectively in series circuit with the first and second light emitting diodes to couple energizing currents to the light emitting diodes in response to forward bias of base emitter junctions of the first and second transistors.

8. The apparatus of claim 6 wherein the first transistor includes first input and first output electrodes having an impedance between them controlled by the voltage applied to the control electrode thereof, the second transistor includes second input and second output electrodes having an impedance between them controlled by the voltage applied to the control electrode thereof, the first and second light emitting diodes having like first electrodes respectively connected to the first and second output electrodes, the first electrode of the first diode being connected between the first electrode of the second light emitting diode and the second output electrode, the second diode having a first electrode of the same polarity as the first electrode of the first diode connected to said terminal and a second electrode connected to the control electrode of the first transistor.

9. The apparatus of claim 4 or 5 or 6 or 7 or 8 wherein the means for forward biasing the first and second light emitting diodes includes a reactive impedance connected in circuit with said second light emitting diode for preventing forward biasing of said second light emitting diode in response to short duration transients in the occurrence of the second signal.

10. The apparatus of claim 5 or 6 or 7 or 8 wherein the means for forward biasing the first and second light emitting diodes includes a reactive impedance connected in circuit with said second light emitting diode for preventing forward biasing of said second light emitting diode in response to short duration transients in the occurrence of the second signal, said reactive impedance being a capacitor in shunt with the second light emitting diode and responsive to current in the second path so that short duration currents resulting from the transient occurrences of the second signal in the second path are shunted to the capacitor to prevent activation of the second light emitting diode into a light emitting state.

11. The apparatus of claim 5 or 6 or 7 or 8 wherein the means for forward biasing the first and second light emitting diodes includes a reactive impedance connected in circuit with said second light emitting diode for preventing forward biasing of said second light emitting diode in response to short duration transients in the occurrence of the second signal, a common current limiting resistor connected to the first and second paths for establishing a constant current in said first and second paths while said paths are in a conducting state, said reactive impedance being a capacitor in shunt with a series circuit including said resistor and the second light emitting diode and responsive to current in the second path so that the short duration currents resulting from the transient occurrences of the second signal in the second path are shunted to the capacitor to prevent activation of the second light emitting diode into a light emitting state.

12. The apparatus of claim 4 wherein the rectifier means includes first and second transistors having bases respectively responsive to the channels of the stereo signal, a single capacitor connected to the emitters of said first and second transistors, said DC level being derived across the single capacitor.

13. The apparatus of claim 5 or 6 or 7 or 8 wherein the rectifier means includes third and fourth transistors having bases respectively responsive to the channels of the stereo signal, a single capacitor connected to the emitters of said third and fourth transistors, said DC level being derived across the single capacitor.

14. The apparatus of claim 5 or 6 or 7 or 8 wherein the means for forward biasing the first and second light emitting diodes includes a reactive impedance connected in circuit with said second light emitting diode for preventing forward biasing of said second light emitting diode in response to short duration transients in the occurrence of the second signal, a common current limiting resistor connected to the first and second paths for establishing a constant current in said first and second paths while said paths are in a conducting state, said reactive impedance being a capacitor in shunt with a series circuit including said resistor and the second light emitting diode and responsive to current in the second path so that the short duration currents resulting from the transient occurrences of the second signal in the second path are shunted to the capacitor to prevent activation of the second light emitting diode into a light emitting state, the rectifier means including third and fourth transistors having bases respectively responsive to the channels of the stereo signal, a single capacitor connected to the emitters of said third and fourth transistors, said DC level being derived across the single capacitor.

15. Apparatus for visually indicating whether either channel of a stereo signal has a level that exceeds an allowable safe limit for a recorder for the signal and for indicating whether either channel of the signal exceeds a minimum threshold level comprising rectifier means responsive to both channels of the signal for deriving a DC level indicative of the amplitude of the channel having the highest level, first and second light emitting diodes which, when forward biased, emit radiation associated with different colors, and means responsive to the derived DC level for forward biasing the first light emitting diode to the exclusion of the second light emitting diode in response to the DC level having an amplitude associated with either of the channels being above the minimum level and both of the channels being less than the allowable safe limit and forward biasing the second light emitting diode to the exclusion of the first light emitting diode in response to the DC level having an amplitude associated with either of the channels being above the allowable safe limit.

16. Apparatus for indicating whether an input signal has an amplitude above a minimum threshold level or above a maximum desired level greater than the minimum level comprising comparator means responsive to the input signal and a reference level for deriving first and second signals in response to the input signal being respectively above the minimum level and the desired level so that both first and second signals are derived in response to the input signal being above the maximum level, first and second light emitting diodes which, when forward biased, emit radiation associated with different colors, and means responsive to the first and second signals for forward biasing the first light emitting diode to the exclusion of the second light emitting diode in response to the first signal being derived to the exclusion of the second signal and for forward biasing the second light emitting diode to the exclusion of the first light emitting diode in response to both of the first and second signals being derived.

17. The apparatus of claim 16 wherein the means for forward biasing the first and second light emitting diodes includes first and second transistors respectively having first and second control electrodes responsive to the first and second signals, as well as first and second paths respectively controlled by the voltages at said first and second control electrodes to supply forward biasing currents to said first and second light emitting diodes, and a feedback connection responsive to the bias of the second light emitting diode for applying a voltage to the control electrode of the first transistor to cut-off current flow through the first transistor and the first light emitting diode while the second light emitting diode is forward biased to a light emitting state.

18. The apparatus of claim 17 wherein the feedback connection includes a first diode having first and second electrodes respectively connected to be responsive to current supplied by the second path to the second light emitting diode and to a terminal responsive to voltage from the first signal, a second diode connected between said terminal and the control electrode of the first transistor, said first diode being poled to pass current from the second path to the terminal in response to the second light emitting diode being forward biased, said second diode being poled to be back biased in response to the current flowing through the first diode to the terminal.

19. The apparatus of claim 18 wherein the first and second transistors respectively include first and second emitter collector impedances in the first and second paths, the first and second emitter collector impedances being respectively in series circuit with the first and second light emitting diodes to couple energizing currents to the light emitting diodes in response to forward bias of base emitter junctions of the first and second transistors.

20. The apparatus of claim 18 wherein the first transistor includes first input and first output electrodes having an inpedance between them controlled by the voltage applied to the control electrode thereof, the second transistor includes second input and second output electrodes having an impedance between them controlled by the voltage applied to the control electrode thereof, the first and second light emitting diodes having like first electrodes respectively connected to the first and second output electrodes, the first electrode of the first diode being connected between the first electrode of the second light emitting diode and the second output electrode, the second diode having a first electrode of the same polarity as the first electrode of the first diode connected to said terminal and a second electrode connected to the control electrode of the first transistor.

* * * * *